United States Patent [19]

Mitsuoka

[11] Patent Number: 4,675,543

[45] Date of Patent: Jun. 23, 1987

[54] DRIVE CIRCUIT FOR GATE TURNOFF THYRISTOR

[75] Inventor: Hiroshi Mitsuoka, Itami, Japan

[73] Assignee: Mitsubishi Denki Kabushiki Kaisha, Tokyo, Japan

[21] Appl. No.: 839,595

[22] Filed: Mar. 14, 1986

[30] Foreign Application Priority Data

Apr. 5, 1985 [JP] Japan .................................. 60-72936

[51] Int. Cl.⁴ ............................................ H03K 17/72
[52] U.S. Cl. .................................. 307/252 C; 307/305
[58] Field of Search ............... 307/252 C, 252 M, 305

[56] References Cited

U.S. PATENT DOCUMENTS 3,348,073 10/1967 Oudard ........................... 307/252 C

FOREIGN PATENT DOCUMENTS 0069550 9/1977 Japan ............................... 307/252 C Primary Examiner—John Zazworsky

[57] ABSTRACT

A drive circuit for a gate turnoff thyrister (GTO) having a combination of a first switching element and a primary coil of a reactor connected in series between the anode of a power source and the gate electrode of the GTO, a secondary coil of the reactor magnetically coupled with the primary coil thereof and a second switching element connected in series between the gate electrode and cathode of the GTO and adapted to turn "on" at or above a predetermined voltage. By turning the first switching element on, a forward drive direction primary current of the GTO is generated and flows from the power source and through the primary coil to the gate of the GTO to allow a main circuit current to flow through the GTO. By turning the first switching element off, a reverse drive direction reactor current in the secondary coil of the reactor when the forward drive direction primary current flowing through the primary coil has been interrupted is generated and flows from the cathode of the GTO toward the gate electrode of the GTO through the second switching element to turn the GTO off so that the main circuit current through the GTO is interrupted.

7 Claims, 6 Drawing Figures

DRIVE CIRCUIT FOR GATE TURNOFF THYRISTOR

BACKGROUND OF THE INVENTION

This invention relates to improvements in a drive circuit for a gate turnoff thyristor.

The gate turnoff thyristor (hereinbelow, termed "GTO") is an element of the so-called self-extinguishing type having a gate electrode in which a main current can be turned "off" by causing a negative reverse current to flow to the gate electrode. Since it does not require a commutation circuit, it has the advantage that devices can be made smaller in size. It has therefore come into extensive use in chopper circuits, various inverter devices, etc. However, in order to interrupt the main current (anode current) of the GTO by means of the gate electrode, the negative reverse gate current needs to rise quickly, to exhibit the longest possible attenuation time and to have a negative peak value large enough to match an anode turnoff current.

FIG. 1 is a diagram showing a typical example of a conventional drive circuit for a GTO. First, the arrangement of this circuit will be explained. Referring to the figure, numeral 2 designates the drive circuit for driving the GTO 1. A switching element capable of turning "on" and "off", such an n-p-n transistor 4, a resistor 5, and a capacitor 6, are connected in series in this order between the anode of a D.C. power source 3 and the gate electrode G of the GTO 1. The cathode of the D.C. power source 3 is connected to the cathode K of the GTO 1. In addition, a resistor 7 and a diode 8 are connected in series, and this series circuit is connected in parallel with the capacitor 6. Further, a reactor 10 is connected in series with a thyristor 9 for discharging current from the capacitor 6 as the reverse gate current of the GTO 1 between the cathode K of the GTO 1 and the node of the capacitor 6 and the resistor 7. Symbol A indicates the anode of the GTO 1.

FIG. 2 is a diagram showing the waveforms at various portions for explaining the operation of the circuit in FIG. 1.

Next, the operation of this circuit will be explained with reference to FIG. 2. Now, under the "off" state of the thyristor 9, a base current $I_b$ as shown at (a) in FIG. 2 is produced at a time $t_1$ to turn the n-p-n transistor 4 "on". Then, a pulse current $i_{GM}$ which rises sharply and has a great peak value as shown at (c) in FIG. 2 flows from the D.C. power source 3 through the resistor 5 as well as the capacitor 6. Subsequently, a forward gate current $i_G$ necessary for holding this ignition of the GTO 1 as shown at (d) in FIG. 2 flows through the resistor 7 as well as the diode 8. That is, the so-called high gate current $(i_{GM}+i_G)$ having an abrupt leading edge and a sufficient trailing edge as shown at (f) in FIG. 2 flows in correspondence with the turnon period of the n-p-n transistor 4, and the GTO 1 is ignited. Next, at a time $t_2$, the n-p-n transistor 4 is turned "off", and the thyristor 9 is simultaneously ignited by causing a gate current $I_G$ to flow as shown at (b) in FIG. 2. Then, the charge with the illustrated polarity and stored in the capacitor 6 due to the pulse current $i_{GM}$ is discharged through the reactor 10, and a reverse gate current $i_{GR}$ as shown at (e) in FIG. 2 flows from the cathode K toward the gate electrode G of the GTO 1 until the main current (anode current) of the GTO 1 is interrupted. The operation during this time interval will be describd in more detail. For a while since the reverse gate current $i_{GR}$ has begun to flow through the GTO 1, the path between the cathode K and gate electrode G of the GTO 1 is in a nearly short-circuited state on account of stored charge, and the reverse gate current $i_{GR}$ of the GTO 1 increases at the rate $(-di_{GR}/dt)$ which is substantially determined by the inductance of the reactor 10 and the charged voltage of the capacitor 6. However, when the junction between the cathode K and the gate electrode G has recovered after a period $t_s$ (storage time), an avalanche voltage develops across the cathode K and the gate electrode G, and the reverse gate current $i_{GR}$ attenuates suddenly. As stated before, in order to interrupt the anode current of the GTO 1 by means of the gate, the attenuation time of the reverse gate current $i_{GR}$ needs to be held sufficient long (at least, equal to the trailing time of the GTO 1). The reactor 10 is therefore inserted even when the rise $(-d_{GR}/dt)$ of the reverse gate current $i_{GR}$ is somewhat sacrificed.

With such a drive circuit for the GTO 1, the rise rate of the reverse gate current $i_{GR}$ is sacrificed for the attenuation time thereof to be ensured. For this reason, the storage time $(t_s)$ in the gate turnoff mode lengthens, which has led to the problem that, not only the operating performance of a device using the GTO 1 is deteriorated, but also the GTO 1 itself is occasionally destroyed because a current concentration period is excessive during the transient process of the turnoff. Moreover, since the two switching elements formed of the n-p-n transistor 4 for causing the forward gate current $i_G$ to flow and the thyristor 9 for causing the reverse gate current $i_{GR}$ to flow need to be alternately driven and controlled so as to be operationally opposite with respect to each other, there has been the problem that a circuit for the control becomes complicated.

SUMMARY OF THE INVENTION

This invention has been made in order to eliminate the problems as mentioned above, and has for its object to provide a drive circuit for a GTO capable of producing a reverse gate current which quickly rises and has a sufficiently long attenuation time for easy control of the GTO.

The drive circuit for a GTO according to this invention includes a first switching element and a primary coil of a reactor connected in series between the anode of a D.C. power source and the gate electrode of the GTO. The cathode of the D.C. power source is connected to the cathode of the GTO, and the secondary coil of the reactor is magnetically coupled with the primary coil. A second switching element connected in series between the gate electrode and cathode of the GTO is further included and adapted to turn "on" at or above a predetermined voltage.

DESCRIPTION OF THE PREFERRED EMBODIMENTS

Now, embodiments of this invention will be described with reference to the drawings. In the description of the embodiments, portions overlapping those in the prior art shall be occasionally omitted.

Figure 1:
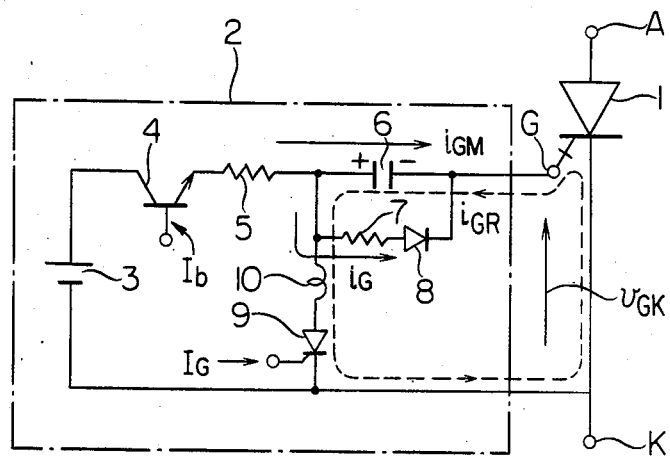
FIG. 1 is a diagram showing a prior-art drive circuit for a GTO.
Figure 2:
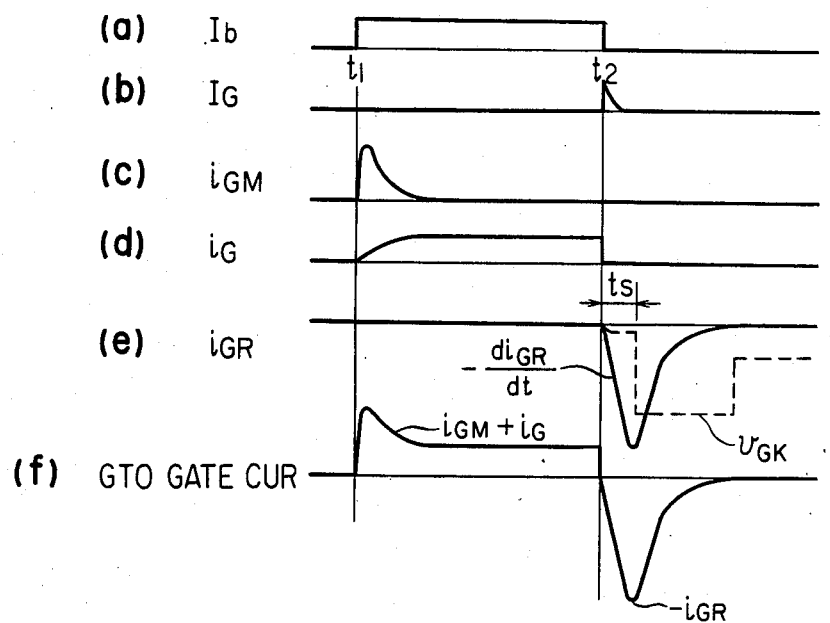
FIG. 2 is a diagram showing the waveforms at various portions for explaining the operation of the circuit in FIG. 1.
Figure 3:
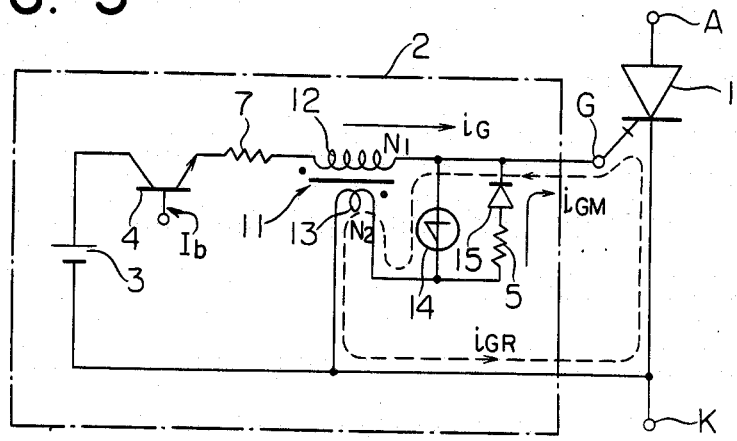
FIG. 3 is a diagram showing a drive circuit for a GTO which is an embodiment of this invention.

FIG. 3 is a diagram showing a drive circuit for a GTO according to the present invention. First, the diagrammatical arrangement of this device will be described. Referring to the figure, numeral 2 designates the drive circuit for driving the GTO 1. A reactor 11 has a primary coil 12 having a number of turns $N_1$ and a secondary coil 13 having a number of turns $N_2$ ($N_1 > N_2$) and the two coils 12 and 13 are magnetically coupled with each other. An n-p-n transistor 4, a resistor 7 and the primary coil 12 are connected in series in this order between the anode of a D.C. power source 3 and the gate electrode G of the GTO 1. Here, the n-p-n transistor 4 serves as a first switching element and is capable of turning "on" and "off". However, any other switching element having an equivalent function may also be used. The cathode of the D.C. power source 3 is connected to the cathode K of the GTO 1. In addition, the secondary coil 13 and a second switching element 14 adapted to turn "on" at a predetermined voltage are connected in series, and the series circuit is connected between the gate electrode G and cathode K of the GTO 1. As illustrated, the second switching element 14 is in the form of a breakover diode. Further, a series circuit formed of a resistor 5 and a diode 15 having opposite polarity to the second switching element 14 is connected in parallel with this switching element 14, forming a current addition means. Symbol A indicates the second anode of the GTO 1.

Figure 4:
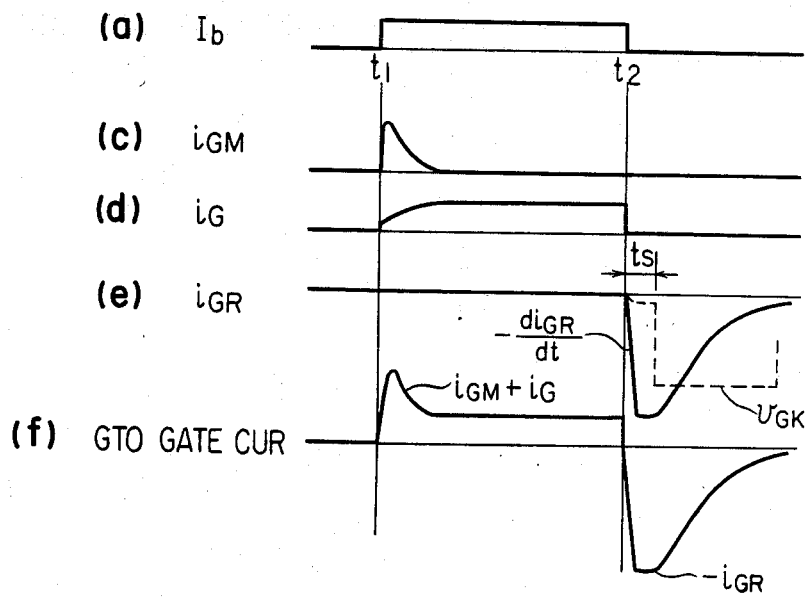
FIG. 4 is a diagram showing the waveforms at various portions for explaining the operation of the circuit in FIG. 3.

FIG. 4 is a diagram showing the waveforms of various signals of different elements of the drive circuit shown in FIG. 3.

Next, the operation of this circuit will be described with reference to FIG. 4. As shown at (a), a base current $I_b$ is produced at time $t_1$ to turn the first switching element 4 on. At this time, a forward gate current $i_G$ as shown at (d) in FIG. 4 is produced by the D.C. power source 3 and flows through the n-p-n transistor 4 as well as the primary coil 12 of the reactor 11 to the gate electrode G to allow a main current to flow thorugh the GTO 1 to the cathode K of the GTO 1. When the base current $I_b$ is interrupted at time $t_2$ and the n-p-n transistor 4 is turned "off", a voltage develops across the secondary coil 13 of the the reactor 11 to turn the second switching element 14 on. Consequently, due to operation of the reactor 11, a reverse gate current $i_{GR}$ (shown as the dashed line in FIG. 3 and (e) of FIG. 4) is generated. This reverse gate current is determined by a product between the forward gate current $i_G$ and a turn ratio $N_1/N_2$ of the reactor 11. As a result, the negative reverse gate current $i_{GR}$ flows from the cathode K toward the gate electrode G of the GTO 1 until the GTO 1 is turned "off". Since the transfer of the current from the primary coil 12 to the secondary coil 13 in this case is performed at a high speed and determined by the turn-off rate of the n-p-n transistor 4, the rise $(-di_{GR}/dt)$ of the reverse gate current $i_{GR}$ is quick, and since the inductance value of the reactor coil 13 can be enlarged without effecting the rise of the reverse gate current $i_{GR}$, the attenuation time of this reverse gate current $i_{GR}$ can be made sufficiently long. In addition, although the forward gate current $i_G$ of the primary coil 12 of the reactor 11 rises comparatively slowly as shown at (d) in FIG. 4 due to the inductance of the primary coil 12, a pulse current $i_{GM}$ as shown at (c) in FIG. 4 is applied from the secondary coil 13. It is therefore possible to supply the so-called high gate current ($i_{GM} + i_G$) having a quick rise and a sufficient peak value as shown at (f) in FIG. 4.

Figure 5A:
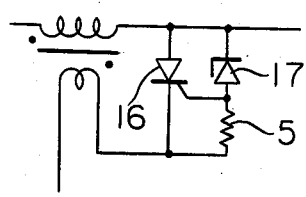
FIGS. 5(A) and 5(B) are diagrams each showing a partial circuit in a drive circuit for a GTO which is another embodiment of this invention.
Figure 5B:
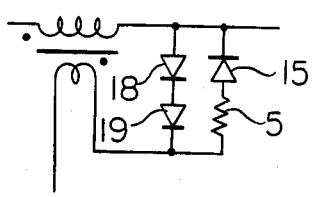

The second switching element 14 adapted to turn "on" at or above the predetermined voltage, which has been exemplified as the breakover diode, may well be a compound circuit in which a thyristor 16 and a Zener diode 17 are combined as illustrated in FIG. 5(A). Alternatively, a series combination of diodes 18 and 19 which has a forward voltage drop slightly exceeding the voltage drop across the gate electrode G and cathode K of the GTO 1 as illustrated in FIG. 5(B) may well be utilized. In these cases, effects similar to those of the foregoing embodiment can be achieved.

As thus far described, according to this invention, the gate of a GTO is driven in a forward direction by the primary coil current of a reactor which has a primary and secondary coils magnetically coupled with each other, while the gate of the GTO is driven reversely by a reactor current which develops in the secondary coil of the reactor when the primary coil current has been interrupted, so as to interrupt the main circuit current of the GTO. A reverse gate current therefore rises quickly and exhibits a sufficiently long attenuation time, to consequently shorten a storage time in the gate turnoff mode, so that the deterioration in operating performance of a device employing the GTO is prevented and that the GTO itself is prevented from being destroyed by an excessive period of current concentration in the transient process of the turnoff. Another effect is that, since the gate current of the GTO can be switched in the forward and reverse directions merely by turning "on" and "off" the primary coil current of the reactor, a control circuit therefor is simple and inexpensive.

What is claimed is:

1. A drive circuit for a GTO comprising:

a D.C. power source;

a reactor including primary and secondary coils;

first switching means connected between said power source and said primary coil for supplying to a gate electrode of the GTO a forward drive direction primary current and for interrupting the supply of the forward drive direction primary current to the gate electrode;

second switching means connected between the gate electrode of the GTO and said secondary coil for supplying to the gate electrode a reverse drive direction reactor current generated by induced voltage in said secondary coil when the forward drive direction primary current is interrupted by said first switching means;

said second switching means including a circuit element providing a predetermined threshold voltage to be overcome by the secondary coil induced voltage before the reverse drive direction reactor current is generated to lengthen the attenuation time of the reverse drive direction reactor current;

whereby the GTO is turned on by the supply of the forward drive direction primary current and is turned off by the reverse drive direction reactor.

2. A drive circuit for a GTO as defined in claim 1 further comprising current addition means connected in parallel with said second switching means to conduct forward drive direction secondary coil current to the gate of the GTO to supplement the forward drive direction primary current.

3. A drive circuit for a gate turnoff thyristor as defined in claim 2, wherein said current addition means comprises a series circuit having third switching means and a resistor.

4. A drive circuit for a GTO as defined in claim 1 wherein said second switching means includes a thyristor.

5. A drive circuit for a GTO as defined in claim 4 further comprising current addition means connected in parallel with said second switching means to conduct forward drive direction secondary coil current to the GTO.

6. A drive circuit for a gate turnoff thyristor as defined in claim 5, wherein said current addition means comprises a series circuit having third switching means and a resistor.

7. A drive circuit for a GTO as defined in claim 1 wherein said second switching means includes a pair of diodes connected in series.

* * * * *